United States Patent [19]

O'Rourke

[11] 4,410,126

[45] * Oct. 18, 1983

[54] MASS SOLDERING SYSTEM

[75] Inventor: Harold T. O'Rourke, Milford, N.H.

[73] Assignee: Cooper Industries, Inc., Houston, Tex.

[*] Notice: The portion of the term of this patent subsequent to Aug. 30, 2000 has been disclaimed.

[21] Appl. No.: 409,849

[22] Filed: Aug. 20, 1982

Related U.S. Application Data

[63] Continuation of Ser. No. 951,052, Oct. 12, 1978, which is a continuation-in-part of Ser. No. 897,492, Apr. 18, 1979, abandoned, which is a continuation-in-part of Ser. No. 856,759, Dec. 2, 1977, abandoned.

[51] Int. Cl.³ .............................. B23K 1/02; H05K 3/34
[52] U.S. Cl. .................................. 228/180 R; 228/20; 228/125; 118/63
[58] Field of Search ............... 228/125, 20, 37, 180 R, 228/260; 118/63

[56] References Cited

U.S. PATENT DOCUMENTS

| | | | |
|---|---|---|---|
| 3,500,536 | 3/1970 | Goldschmied | 228/260 X |
| 3,605,244 | 9/1971 | Osborne et al. | 228/37 X |
| 3,705,457 | 12/1972 | Tardoskegi | 228/260 X |
| 3,726,007 | 4/1973 | Keller | 228/260 X |
| 3,765,591 | 10/1973 | Cook | 228/37 X |
| 3,841,557 | 10/1974 | Atkinson | 118/63 X |
| 3,865,298 | 2/1975 | Allen et al. | 228/20 X |
| 4,083,323 | 4/1978 | Rote | 228/20 X |

Primary Examiner—Kenneth J. Ramsey
Attorney, Agent, or Firm—Hayes, Davis & Soloway

[57] ABSTRACT

A soldering system is described in which a fluid stream is directed onto a soldered board substantially immediately following deposition of molten solder onto the board. Preferably, but not necessarily, the fluid, which may comprise a gas or mixture of gases, is heated prior to contacting the board. The impinging fluid stream relocates solder on, and/or blasts excess solder from the bottom of the board, and any interconnections, component leads and/or component bodies carried thereon before the solder solidifies as shorts, icicles or bridges. If desired, liquid droplets such as soldering oil may be included in the fluid stream.

19 Claims, 10 Drawing Figures

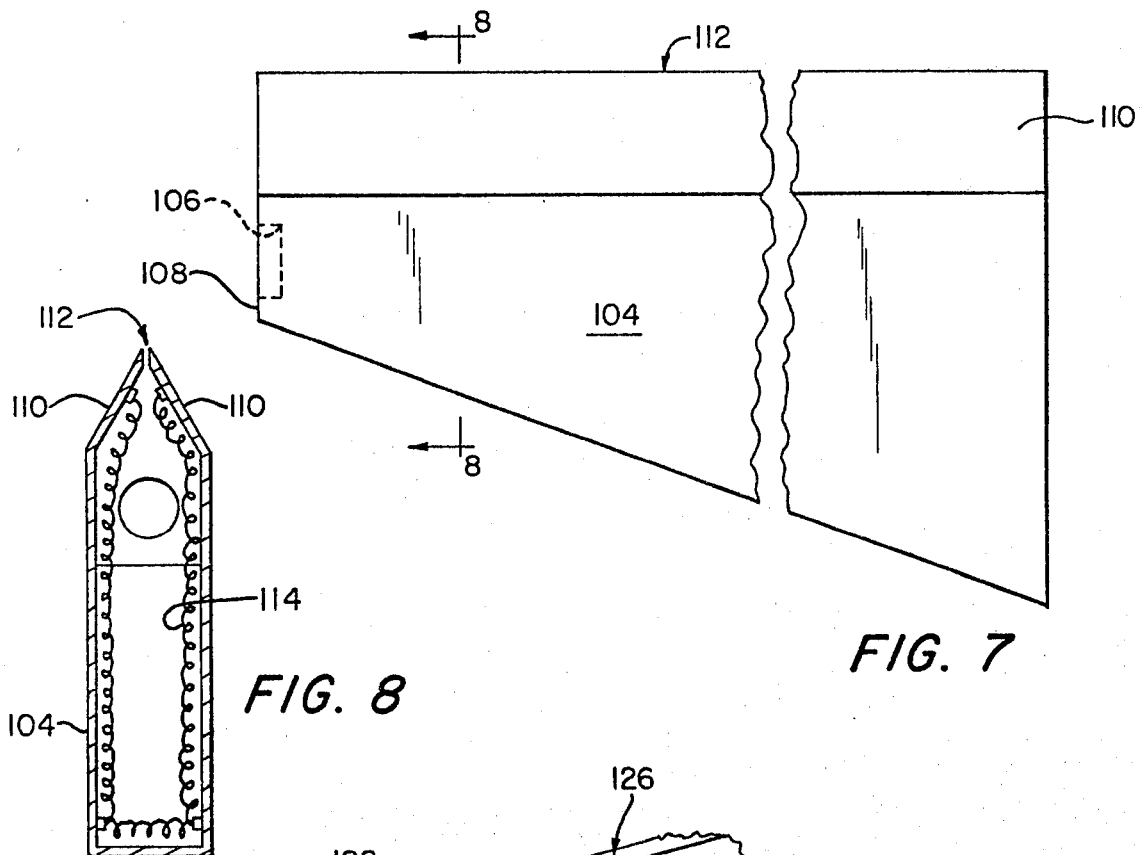
FIG. 7
FIG. 8
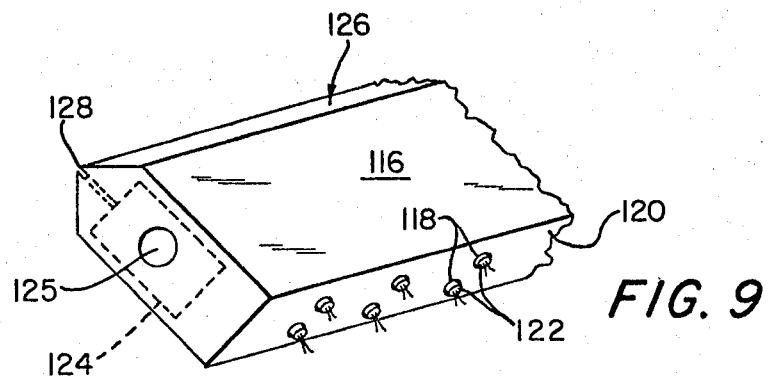
FIG. 9
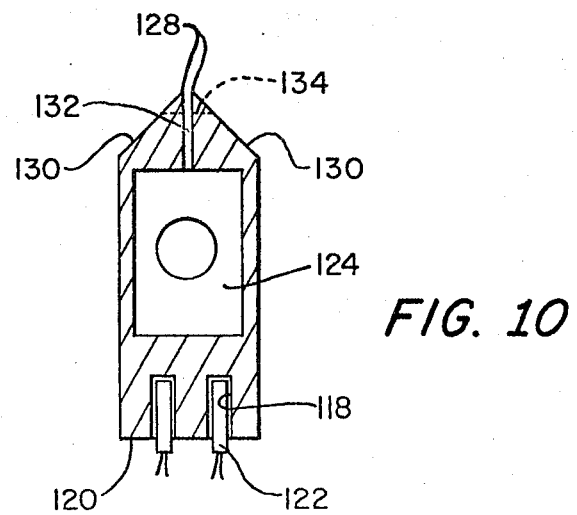
FIG. 10

MASS SOLDERING SYSTEM

The present application is a continuation of my copending application Ser. No. 951,052, filed Oct. 12, 1978, which application in turn is a continuation-in-part of my copending application Ser. No. 897,492, filed Apr. 18, 1978, now abandoned which application in turn is a continuation-in-part of my copending application Ser. No. 856,759, filed Dec. 2, 1977, now abandoned.

The present invention relates to systems for soldering electrical and electronic components onto substrate circuit boards, and more specifically to an improved apparatus and method for mass soldering electrical and electronic components by their leads, to printed circuit boards or the like.

Various soldering systems are well known in the art for mass soldering electrical and electronic components, by their leads, onto printed circuit boards. One technique for mass soldering components to circuit boards is that of dip soldering. With this technique, the entire side of a circuit board containing the printing wiring, with the leads from the components projecting through apertures in the board, is engaged for a certain period of time with the surface of a bath of molten solder, and then removed. Another technique for mass soldering components onto circuit boards is that of wave soldering. A typical prior art wave soldering system generally comprises a container adapted to hold a supply of molten solder and a sump partially submerged in the molten solder. The sump has an intake orifice below the surface of molten solder, and an elongate horizontal nozzle or slot above the surface of the solder. A positive displacement pump is submerged in the body of solder and is adapted to force molten solder into the sump intake orifice, where the molten solder then flows upward in the sump and out the horizontal nozzle to thereby produce a smoothly rounded standing wave of molten solder above the nozzle. Other techniques for mass soldering electrical and electronic components onto printed circuit boards are well known in the art and include cascade soldering, jet soldering and drag soldering. So-called "leadless" components such as flat packs can also be mass soldered to circuit boards by fixing the components to the bottom of a board, e.g. as by fixturing or with an adhesive, and then engaging the bottom of the board and the components with molten solder. While known mass soldering systems have provided substantial manufacturing economy to the electronics industry and thus achieved substantial commercial use, the deposition of excess solder on the board circuits, connections and leads has been a continual problem. Deposition of excess solder may result in formation of shorts, icicles and/or bridges, and will increase solder consumption and finished board weight. Moreover, current trends in the electronics industry to relatively high density electronic assemblies has increased the problem of solder shorts, icicling and bridging.

The prior art has devised various techniques to solve the problems of solder shorts, icicling and bridging. For example, for wave soldering, one technique which has become virtually universally adopted by the industry is to incline the travel path of the circuit boards through the solder wave, i.e. from the horizontal, to increase the exit angle between a board being soldered and the solder wave. The art has also devised various wave geometries for further increasing the exit angle and/or changing the point where a circuit board exits the wave. Another system for reducing the incidence of solder shorts, icicling and bridging, which has achieved substantial commercial acceptance, is to intimately mix soldering oil in the solder wave in accordance with the teachings of Walker et al. U.S. Pat. No. 3,058,441. While such systems have been found to reduce substantially the incidence of solder shorts, bridging and/or icicling, such systems have not entirely eliminated solder shorts, bridges and icicling, particularly in cases where relatively high density electronic assemblies and/or relatively long lead components are being soldered to circuit boards.

It is thus a primary object of the present invention to provide a mass soldering system, i.e. apparatus and process, which overcomes the aforesaid problems of the prior art.

Another object of the present invention is to provide an improved apparatus and process for mass soldering in which the problems of solder shorts, icicling and/or bridging are reduced.

A more specific object is to provide an apparatus and process for mass soldering relatively high density circuit board assemblies.

Still other objects will in part appear obvious and in part will appear hereinafter.

The invention accordingly comprises the processes involving the several steps and relative order of one or more of such steps with respect to each other and the apparatus possessing the features, properties and relations of elements which are exemplified in the following detailed description and the scope of the application of which will be indicated in the claims.

The instant invention overcomes the foregoing and other problems by providing a method and apparatus for removing excess solder from mass soldered boards before the solder solidifies as shorts, icicles or bridges. The method comprises the step of directing a fluid stream onto the bottom of a soldered board substantially immediately following mass deposition of the molten solder onto the board. The fluid stream impinges onto the bottom of the board, and relocates excess solder on, and/or blasts excess solder from the bottom of the board and any interconnections, component leads and/or component bodies carried thereon before the solder solidifies as shorts, icicles or bridges. The fluid may comprise a gas such as an inert gas, or a mixture of gases such as air. If desired, liquid droplets such as soldering oil may be included in the fluid stream. Preferably, but not necessarily, the fluid stream is pre-heated prior to contacting the board.

In the following description the term "solder removal" is used to denote actual displacement of solder from a circuit board, and any interconnections, component leads and/or component bodies thereon, as well as relocation of solder on a circuit board, and any interconnections, component leads and/or component bodies thereon.

The instant method is implemented with a mass soldering apparatus which essentially comprises a soldering station in which a quantity of molten solder can be mass deposited onto the bottom of the board to remove a portion of the solder deposited on the bottom of the board, and any interconnections, component leads and/or component bodies carried thereon before the solder cools below liquidus temperature.

For a fuller understanding of the objects of the present invention, reference should be had to the following detailed description taken in connection with the accompanying drawings in which:

FIGS. 7 and 8 are top plan and cross-sectional views, respectively showing one form of fluid stream directing nozzle structure useful in the soldering apparatus of the present invention;

FIG. 9 is a side elevational view in perspective showing another and preferred form of fluid stream directing nozzle structure useful in the soldering apparatus of the present invention; and FIG. 10 is a side view in cross-section of the nozzle structure of FIG. 9.

In the following detailed description of the present invention, the term "component" refers to leadless components as well as components having conventional metallic conductors or leads. The term "component lead" refers to that part of metallic conductor of an electrical or electronic component that is joined to the printed circuit board pattern, i.e. the component leads, terminals, lugs, pins, etc. The term "land" as used herein refers to that part of the metallic pattern on the printed circuit board to which a component or component lead is joined by solder. The term "fluid" is to be understood to refer to a gas or mixture of gases. If desired, the gas or mixture of gases may also contain liquid droplets dispersed therein. The term "mass soldering" as used herein is intended to refer to any of the several soldering techniques known in the art in which liquid solder is applied to a circuit board from a reservoir of liquid solder, including, by way of example but not limitation: wave soldering, touch or dip soldering, pot soldering, jet soldering, cascade soldering and drag soldering.

Figure 1:
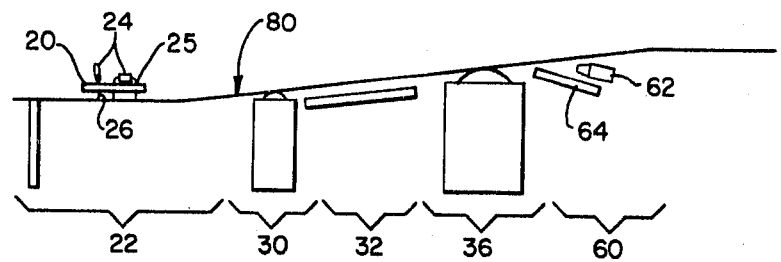
FIG. 1 is a side elevational view, diagrammatically illustrating a mass soldering system according to the present invention.

Referring now to the accompanying drawings, a preferred embodiment of the present invention will be described in combination with a wave soldering system. Referring first to FIG. 1, a printed circuit board 20 is loaded at an insertion station 22, with a plurality of electrical or electronic components 24 at predetermined positions on the board. The board comprises an insulated wiring board having one or more printed metallic conductors on the board underside, and a plurality of apertures 25 which extend through the board. Components 24 are loaded onto the top side of the board with their leads 26 protruding downward through the board apertures 25 in juxtaposition to the circuit lands to which they are to be joined. The components may be inserted in the board by any method known in the art which may include manual assembly, semi-automatic, or automatic assembly which may comprise single-station of multiple-station pantagraph or numerically controlled machines all of which are well known in the art and need not be described further.

The next step involves treating the surfaces to be soldered with a so-called flux at a fluxing station 30. The flux may be any flux well known in the art and may include, for example, a water-white rosin flux, an activated rosin flux or a water soluble flux. The flux may be applied in fluxing station 30 by any manner well known in the art, for example, by spraying, foaming, brushing, or from a flux wave.

The board is then passed from fluxing station 30 to a preheating station 32 where the board is preheated to mobilize the flux and also drive off the bulk of the flux solvent to form an active flux layer on the board and leads. Preheating station 32 may comprise infrared or convection heaters or a combination of infrared and convection heaters as are well known in the art. Preferably, but not necessarily, preheating station 32 is extended as compared with conventional preheating stations, and/or preheating station 32 may be operated at higher than normal temperatures so that the board 20 is heated to higher than normal top side temperatures. Thus board 20 will be preheated to a minimum top side temperature of about 66° C.; preferably however, the board will be preheated to a top side temperature in the range of about 100° C.–125° C. or higher. The purpose of preheating the board to higher than normal top side temperatures is to increase the time the solder on the board remains molten after the board emerges from the solder wave. The reason for this will become clear from the description following.

Figure 2:
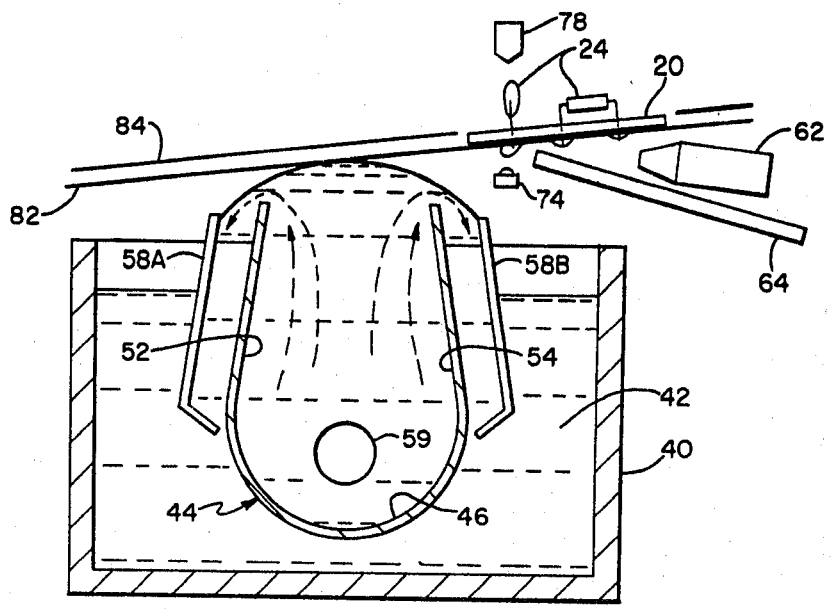
FIG. 2 is a side elevational view, partly in section, of the soldering apparatus portion of the soldering system of FIG. 1.
Figure 3:
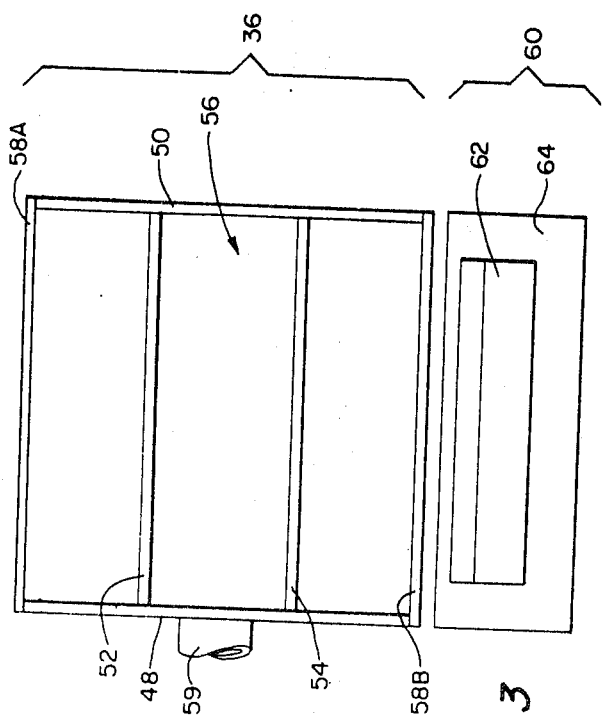
FIG. 3 is a top plan view of the soldering apparatus portion of FIG. 2.

The fluxed preheated board is then passed to a mass wave soldering station 36. Referring also to FIGS. 2 and 3 the wave soldering station includes a container of conventional design, indicated generally at 40, for holding a supply of molten solder 42. Conventional heating means (not shown) may be secured to the bottom and/or side walls of container 40 or immersed in the solder to heat and maintain the supply of solder 42 in molten condition.

A sump and nozzle assembly indicated generally at 44 is disposed interiorly of container 40. The sump and nozzle assembly 44 is of conventional design and typically comprises a rounded bottom wall 46, a pair of substantially vertically opposed end walls 48 and 50, and a pair of inclined side walls 52 and 54. The upper ends of end walls 48 and 50 and side walls 52 and 54 are spaced from one another to form a narrow elongated rectangular nozzle or slot 56 which extends above the molten solder level in container 40 for a suitable distance, e.g. one inch above the molten solder level.

Preferably, the sump also includes a pair of adjustable sluice plates 58A, B spaced from the sump side walls 52 and 54 for controlling solder overflow from the nozzle 56, e.g. in accordance with the teachings of U.S. Pat. No. 3,398,873 to Kenneth G. Boynton. Completing the soldering station is a variable speed pump (not shown) which communicates through an intake orifice 59 in the lower end of sump and nozzle assembly 44 for pumping solder into the sump where it then rises and overflows the nozzle 56 as a standing solder wave.

An important feature and critical requirement of the present invention is the ability to relocate excess solder on, and/or remove excess solder from the bottom of the circuit board, and from any interconnections, component leads and/or component bodies carried thereon before the solder can solidify as shorts, icicles and/or bridges. This is accomplished by treating the soldered circuit board and depending component leads at an excess solder removal station 60. Excess solder removal station 60 follows soldering station 36 immediately in-line and is designed to relocate or blow off excess solder from the board underside before the solder solidifies as shorts, icicles and/or bridges. Solder removal station 60 comprises one or more fluid jets, fluid knives, slots, nozzles or the like indicated generally at 62, from which a fluid stream can be directed onto the underside of the board. If desired, a baffle plate 64 may be disposed under the path of travel of boards 20 at an angle of approximately 45° from the horizontal and serves as a deflector for the fluid stream issuing from nozzle 62. Desirably, but not necessarily, the fluid is pre-heated prior to impinging on the board. Fluid flow rate, fluid pressure, and fluid temperature and the time elapsed between circuit board emersion from the solder wave and beginning of contact by the fluid stream may vary widely depending on the board temperature, ambient temperature, melting point of the solder, specific heat of fluid and heat transfer coefficient of fluid to the board, board size and shape, component density, amount of solder deposited and to be removed, conveyor speed, and distance between the soldering station and the excess solder removal station. Preferably nozzle 62 is disposed proximate the path of travel of the boards. Nozzle 62 of course must be spaced sufficiently below the path of travel of the boards to permit clearance of the longest depending lead, etc. Inert gas may be used as the fluid, but preferably the impinging fluid comprises air. The fluid may be at ambient temperature preferably however, the fluid is pre-heated to a temperature in the range of about 93° C. to 350° C., preferably about 290° C. to 300° C. (measured at the outlet of nozzle 62). For 63/37 solder alloy, the preferred fluid preheat temperature is about 290° C. (measured at the outlet of nozzle 62).

The fluid stream impinging on still molten solder contained on the underside of the circuit board, the interconnections, and the component leads and/or bodies relocates excess solder on, and/or blasts excess solder from the underside of the board, interconnections, leads, and bodies, and in doing so also minimizes the possibility of solder bridging or icicling or short formation upon solidification.

Figure 4:
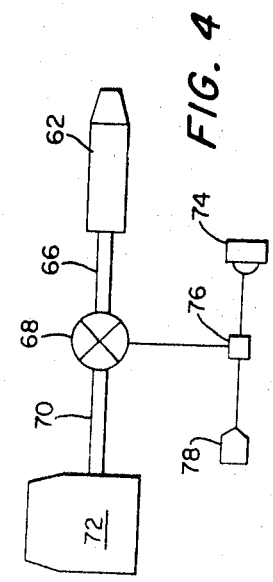
FIG. 4 is a schematic diagram of the electrical and pneumatic control means of the same apparatus.

FIG. 4 illustrates a preferred form of electrical and pneumatic control means in accordance with the present invention and is particularly adapted to the use of hot air as the fluid stream in accordance with the present invention. Referring to FIG. 4, nozzle 62 is connected via supply line 66 to one side of solenoid actuated valve 68. Valve 68 is connected via a line 70 to the outlet of a heater 72 which is adapted to heat air (or other gas) to a desired elevated temperature. Valve 68 is actuated by a photoelectric cell 74 connected through suitable relay means 76 to provide a blast of heated air when a printed circuit board 20 passes through the solder wave and the board leading edge interrupts a light beam from light sources 78 disposed above the path of travel of the printed circuit board. The flow of heated air continues until the trailing edge of the printed circuit board passes and permits the beam of light from light source 78 to fall once again upon the photoelectric cell 74, at which time the valve 68 is closed or nearly closed. Preferably valve 68 is prevented from closing fully, i.e. so as to allow at least a small flow of heated air through the nozzle so that the nozzle will be maintained at the desired elevated temperature and thus eliminate thermal lag.

Completing the soldering system is a circuit board conveyor 80 of conventional construction. The latter comprises a pair of spaced conveyor rails 82 and 84 and suitable drive means (not shown) for carrying a circuit board from the inserting station 22 through the fluxing station 30, wave soldering station 36 and excess solder removal station 60.

Figure 5:
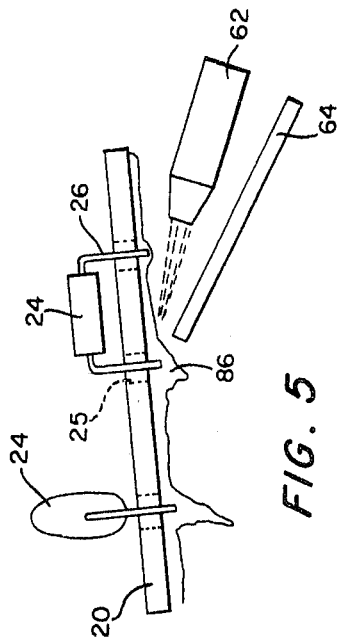
FIG. 5 is an enlarged, side elevational view in section, of a portion of the apparatus of FIG. 2, showing a circuit board assembly at an intermediate stage in the process of the present invention, and showing how excess solder is removed in accordance with the present invention.

FIG. 5 shows a printed circuit board in the excess solder removal station 60 and illustrates how the hot fluid flow removes molten solder 86 from a circuit board, interconnections and component leads in accordance with the present invention.

One skilled in the art will be able to determine experimentally the preferred operating parameters for achieving icicle-, bridge- and short-free mass soldering for the particular board being soldered.

For example, to eliminate solder icicles, bridges and shorts from a circuit board which measures 6.35 and 15.24 cm. and includes a net circuit plan area of approximately 96.75 sq. cm., 150 plated through apertures of 0.0762 cm. diameter, and including 150 component leads of 0.0508 cm. diameter (50% steel leads, 50% copper leads), solder alloy of 63/37, solder bath temperature 252° C., preheat temperature of about 125° C. (top side) conveyor speed of 0.018 m/sec., and employing hot air (290° C., measured at the outlet of nozzle 62), at a Pitot tube pressure (measured approximately 0.6 cm from the outlet of nozzle 62) of about 22.5 mm Hg, and a fluid velocity (measured at the outlet of nozzle 62) of about 76 m/sec., as the impinging fluid, the distance between the point where the circuit board emerges from the solder wave and begins to pass the hot air stream should be in the range of about 19 to 25 cm. One skilled in the art will recognize that the various aforesaid parameters are interrelated and may be varied to achieve the foregoing objects of the present invention.

Moreover, the present invention has a number of advantages. For one, contacting the underside of a circuit board with a fluid stream in accordance with the present invention has been found to level the solder coating on the board conductors. Moreover, eyelets and unloaded plated through holes may be cleared by the fluid stream. Another advantage is that a soldered board may emerge from the system somewhat cooler as compared with conventional mass soldering systems. This latter advantage results primarily from the removal of excess solder which is a major heat sink on conventionally soldered boards. Moreover, the fluid stream, if cooler than the solder on the board, may further speed cooling. Cooling the board facilitates handling of the board subsequent to soldering and also may result in reduced incidence of pad lift in solder-cut-solder systems. Cooling the board also may result in production of solder joints of finer grain.

Figure 6:
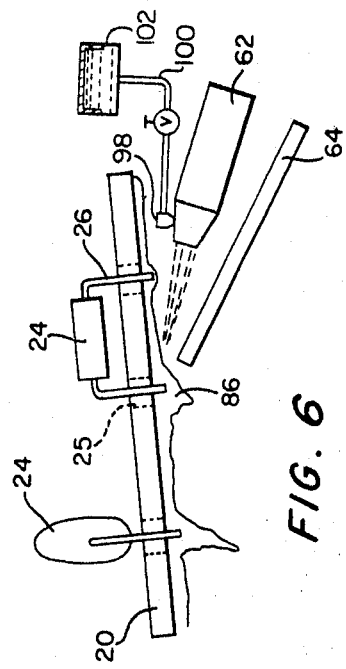
FIG. 6 is a view similar to FIG. 5 illustrating an alternative soldering apparatus according to the present invention.

Various changes may be made in the foregoing invention without departing from the inventive features described herein. For example, one or more banks of heaters, similar to construction to the preheaters may be incorporated into the excess solder removal station 60 to extend the time the solder remains molten on the board. Moreover, where the fluid comprises a gas or gas mixture, a minor amount, e.g. up to about 20% by weight of liquid droplets may be dispersed in the gas stream, for example, by aspirating the liquid into the gas stream from one or more aspirator nozzles 98 as shown in FIG. 6. Aspirator nozzles 98 are connected through conduit means 100 to a supply 102 of the liquid to be dispersed into the gas stream. Obviously, the liquid droplets could be injected into the gas stream using one or more atomizing nozzles. The liquid should comprise a material which is compatible with the soldering operation. By way of example, the liquid may comprise a conventional soldering oil or mixture of oils. The liquid droplets increase the fluid flow mass of the gas stream and thus in turn may result in an increased rate of solder removal from the board and leads. Also, employing a soldering oil as the liquid may facilitate post-soldering clean-up and may also produce shinier solder joints. If desired, conventional wetting agents and/or fluxing agents may also be dispersed in the fluid stream. Also, one or more heater elements may be incorporated integrally with nozzles 62, e.g. as shown in FIGS. 7 to 10 to supplement and/or in place of heater 72.

Referring in particular to FIGS. 7 and 8, the illustrated heater/nozzle combination comprises a manifold in the form of a flat, elongate trapezoidal hollow chamber indicated generally at 104. An intake orifice 106 is formed in the short side wall 108 of manifold 104, and is coupled through conduit means (not shown) to a source of pressurized air (not shown). One of the long walls 110 of manifold 104 is tapered to form an elongate knife-edged orifice 112. The latter defines the nozzle outlet for directing a fluid stream onto a circuit board in accordance with the present invention. Manifold 104 is formed of a heat resistant material such as welded steel plate. Mounted in the interior of manifold 104 is a heating means such as one or more electrical resistance heater elements 114. Electrical resistance heater elements 114 are known in the art and are available commercially. If desired, the manifold walls may be thermally insulated in known manner. In operation the fluid stream is heated by passing over the resistance heaters 114.

Another and preferred embodiment of heater/nozzle combination is shown in FIGS. 9 and 10. In the illustrated preferred embodiment the nozzle comprises a generally rectangular block 116. Block 116 is formed of a heat resistant material such as steel. A plurality of blind holes 118 are formed in one side wall 120 of block 116 and accommodate a like number of cartridge heaters 122. Cartridge heaters are well known in the art and are available commercially. A hollow chamber 124 is formed in the interior of block 116, and an inlet orifice 125 is formed in one end wall of block 116 and connects hollow chamber 124, through conduit means (not shown) to a source of pressurized air (not shown). The nozzle outlet orifice is formed in the side wall 126 opposite the wall 120 in which cartridge heaters 122 are mounted. As seen in FIG. 10 wall 126 is bevelled so as to form a pair of parallel end edge surfaces 128 formed at the intersection of inclined surfaces 130 with elongate passageway 132. The latter communicates with hollow chamber 124. Edge surfaces 128 should be substantially flush with one another, and may be substantially knife edges as shown or may have a more substantial width as would be produced by truncating the end of the nozzle outlet along a plane as represented by dotted line 134. An interesting feature and advantage of truncating the nozzle outlet to give it a substantial width is that the working gas stream emerging from the nozzle is found to be especially smooth. Also, with a nozzle outlet of this type secondary air streams have been observed to form to either side of the working gas stream. These secondary air streams provide fluid insulating sheets for the working gas stream and may also directly assist in relocating or removing solder.

While the solder removal station in accordance with the present invention has been illustrated in conjunction with a mass wave soldering system one skilled in the art will recognize that similar advantages may be achieved by employing a solder removal station in conjunction with other types of mass soldering systems such as dip, cascade, jet and drag soldering systems. Still other changes will be obvious to one skilled in the art. Accordingly, it is intended that all matter contained in the above description or shown in the accompanying drawings shall be interpreted in an illustrative and not in a limiting sense.

What is claimed is:

1. A method of mass joining with solder printed circuit boards having mounted thereon components with leads protruding downward through holes in said board, said method comprising the steps of:

depositing a quantity of molten solder onto the underside of said board and said downward protruding leads by passing the bottom surface of the board over a solder wave and substantially immediately following said depositing impinging a stream of heated air directly into the molten solder deposited on the underside of said board and said protruding leads by means of an air knife blast directed towards the solder wave and impinging on the bottom surface of the board sufficiently soon after it leaves the solder wave so that the solder is still molten, the air knife blast having sufficient velocity to remove essentially all bridges and shorts but not sufficient velocity to adversely affect properly wetted joints.

2. A method according to claim 1, wherein said air stream is heated to a temperature in the range of 93° C. to 350° C.

3. A method according to claim 2, wherein said air stream is heated to a temperature in the range of about 290° C. to 300° C.

4. A method according to claim 1, further including the step of dispersing liquid droplets in said air stream, and directing the resultant dispersion onto said board and leads.

5. A method according to claim 4, wherein said liquid droplets comprise soldering oil.

6. A method according to claim 4, wherein said liquid droplets comprise a wetting agent.

7. A method according to claim 4, wherein said liquid droplets comprise a flux agent.

8. A method of reducing the incidence of solder shorts, icicling and/or bridging in a mass soldering process in which a quantity of molten solder is deposited onto the underside of a component-carrying printed circuit board and onto those parts of said components which extend below said board underside and at least partially fill with molten solder any holes in said board, said method comprising the steps of:

depositing a quantity of molten solder onto the underside of said board and said component parts by passing the bottom surface of said board over a solder wave and substantially immediately following said depositing impinging a stream of heated air directly onto the molten solder deposited on the underside of said board and said component parts by means of an air knife blast directed towards the solder wave and impinging on the bottom surface of said board sufficiently soon after it leaves the solder wave so that the solder thereon is still molten, the air blast having sufficiently low velocity to leave a solder coating in said holes and sufficiently high velocity to remove solder shorts, bridges and icicles remaining on said board as it leaves the solder wave, the air blast increasing forces tending to remove the solder shorts, bridges and icicles.

9. A method according to claim 8 wherein said air stream is heated in a temperature in the range of 93° C. to 350° C.

10. A method according to claim 9, wherein said air stream is heated to a temperature in the range of about 290° C. to 300° C.

11. A method according to claim 8, further including the step of dispersing liquid droplets in said air stream, and directing the resultant dispersion onto said board and leads.

12. A method according to claim 11, wherein said liquid droplets comprise soldering oil.

13. A method according to claim 11, wherein said liquid droplets comprise a wetting agent.

14. A method according to claim 11, wherein said liquid droplets comprise a flux agent.

15. Apparatus for mass joining with solder electrical and electronic components assembled in a circuit board wherein said components have leads which protrude downward through apertures in the board, and comprising in combination:
 a wave soldering station adapted to provide a wave of molten solder;
 means for transporting said circuit board across said solder whereby a quantity of molten solder may be deposited onto said circuit board underside and said protruding leads; and
 an excess solder removal station adjacent said wave soldering station, said excess solder removal station comprising at least one hot air knife disposed below the travel path of said board and adapted to direct a blast of heated air directly onto the molten solder deposited on said board underside, a source of pressurized air, means connecting said source and said hot air knife, and means for heating said air knife blast prior to directing the latter onto said board underside, the air knife blast being directed towards the solder wave and impinging on the bottom surface of the board sufficiently soon after it leaves the solder wave so that the solder is still molten, the air knife blast having sufficient velocity to remove essentially all bridges and shorts but not sufficient velocity to adversely affect properly wetted joints.

16. Apparatus according to claim 15, and further including means for introducing liquid droplets into said air stream.

17. Apparatus according to claim 16, including a source of said liquid, and wherein said means for introducing comprises at least one aspirator connected to said source of said liquid.

18. Apparatus according to claim 16, including a source of said liquid, and wherein said means for introducing comprises at least one atomizing nozzle connected to said source of said liquid.

19. The apparatus of claim 15, wherein said air knife is provided with valve means to give a continuous small flow of air through the knife; and means for detecting the presence of a board over the solder wave to open the valve and provide a full air blast to the board as it leaves the wave.

* * * * *

UNITED STATES PATENT AND TRADEMARK OFFICE
CERTIFICATE OF CORRECTION

PATENT NO. : 4,410,126
DATED : October 18, 1983
INVENTOR(S) : Harold T. O'Rourke It is certified that error appears in the above—identified patent and that said Letters Patent is hereby corrected as shown below:

Claim 1, line 27, the term "into" should be --onto--.

Claim 9, line 12, the term "in" (first occurrence) should be --to--.

Signed and Sealed this

Twenty-ninth Day of May 1984

[SEAL]

Attest:

Attesting Officer

GERALD J. MOSSINGHOFF

Commissioner of Patents and Trademarks